United States Patent [19]

Higashi et al.

[11] Patent Number: 5,464,686
[45] Date of Patent: Nov. 7, 1995

[54] PRESENSITIZED PLATE FOR USE IN MAKING LITHOGRAPHIC PRINTING PLATE REQUIRING NO DAMPENING WATER

[75] Inventors: Tatsuji Higashi; Noboru Yasuda, both of Shizuoka, Japan

[73] Assignee: Fuji Photo Film Co., Ltd., Minami-Ashigara, Japan

[21] Appl. No.: 184,349

[22] Filed: Jan. 21, 1994

Related U.S. Application Data

[63] Continuation of Ser. No. 787,817, Nov. 5, 1991, abandoned.

[30] Foreign Application Priority Data

Nov. 7, 1990  [JP]  Japan ..................................... 2-301876

[51] Int. Cl.$^6$ .............................. G03C 1/76; G03F 7/033
[52] U.S. Cl. ........................ 430/272; 430/162; 430/175; 430/176; 430/273; 430/288; 430/303
[58] Field of Search ..................................... 430/303, 272, 430/273, 285, 288, 175, 162, 176, 908

[56] References Cited

U.S. PATENT DOCUMENTS

| | | | |
|---|---|---|---|
| 3,380,831 | 4/1968 | Cohen et al. | 430/288 |
| 5,059,511 | 10/1991 | Higashi et al. | 430/272 |
| 5,126,228 | 6/1992 | Higashi et al. | 430/272 |

FOREIGN PATENT DOCUMENTS 0386777  9/1990  European Pat. Off. .

*Primary Examiner*—Janis L. Dote
*Attorney, Agent, or Firm*—Burns, Doane, Swecker & Mathis

[57] ABSTRACT

A PS plate requiring no dampening water comprises a substrate provided thereon with, in order, a light-sensitive resin layer and a silicone rubber layer, wherein the light-sensitive resin layer is formed from a light-sensitive composition which comprises the following components:

(i) at least one monomer represented by the following general formula (I):

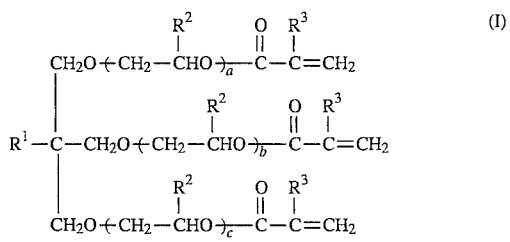

(wherein $R^1$ represents, for instance, H or a substituted or unsubstituted alkyl group having 1 to 10 carbon atoms; a to f each independently represents an integer; $R^2$ and $R^3$ each independently represents H or a methyl group); (ii) a photopolymerization initiator; and (iii) a polymeric compound having film-forming ability. The hardening properties of the silicone rubber layer is greatly improved and thus there can be obtained a PS plate exhibiting high sensitivity and hence lithographic printing plates having good printing durability.

22 Claims, No Drawings

PRESENSITIZED PLATE FOR USE IN MAKING LITHOGRAPHIC PRINTING PLATE REQUIRING NO DAMPENING WATER

This application is a continuation of application Ser. No. 07/787,817, filed Nov. 5, 1991 now abandoned.

BACKGROUND OF THE INVENTION

The present invention relates to a presensitized plate requiring no dampening water which is suitable for use in making a lithographic printing plate which makes it possible to perform printing operations without using any dampening water.

There have been proposed various presensitized plate requiring no dampening water (hereinafter referrd to as "PS plate requiring no dampening water") for use in making a lithographic printing plate for performing lithographic printing without using any dampening water (hereinafter referred to as "lithographic printing plate requiring no dampening water"). Among these, PS plates requiring no dampening water which comprise a substrate provided thereon with, in order, a light-sensitive resin layer and a silicone rubber layer exhibit very excellent quality and are disclosed in, for instance, Japanese Patent Publication for Opposition Purpose (hereinafter referred to as "J.P. KOKOKU") Nos. Sho 54-26923 (=U.S. Pat. No. 3,894,873) and Sho 55-22781 (=British Patent No. 1,419,643).

The silicone rubber layer used in these PS plates requiring no dampening water have currently been those obtained by partially crosslinking polymers comprising, as the main skeleton, polysiloxane with crosslinking agents. The following two methods have usually been adopted for hardening the silicone rubber layer.

(1) Condensed Silicone Rubber Layer: An organopolysiloxane having hydroxyl groups at both ends is crosslinked with a silane or siloxane carrying a hydrolyzable functional group directly bonded to the silicon atom thereof to give a silicone rubber.

(2) Addition Type Silicone Rubber Layer: A polysiloxane having ≡Si—H groups and a polysiloxane having —CH=CH— groups are subjected to an addition reaction to give a silicone rubber (see, for instance, Japanese Unexamined Patent Publication (hereinafter referred to as "J.P. KOKAI") No. Sho 61-73156 and No. Hei 3-161753).

The condensed silicone rubber (1) changes its curing properties and adhesion to a light-sensitive layer depending on the moisture content of the atmosphere during hardening and, therefore, it suffers from the problems that if it is used for preparing a PS plate requiring no dampening water, the sensitivity thereof easily varies and that the stable production thereof is very difficult. For this reason, it is considered that the addition type silicone rubber is rather excellent since it does not suffer from such drawbacks.

There have been used, as a light-sensitive resin layer for positive-working PS plates, those obtained from a photopolymerizable light-sensitive composition which is hardened through exposure to light. In the PS plate having such a layer structure, images are in general formed by exposing it to light for hardening the light-sensitive resin layer, or optionally photoadhering the light-sensitive layer to the silicone rubber layer as the upper most layer at the interface therebetween to thus firmly link these layers and prevent the permeation of a developer into the exposed region and the leaching of the light-sensitive resin layer. A non-image area comprising the silicone rubber layer is thus formed. On the other hand, an image area is formed by permeating a developer into the unhardened light-sensitive resin layer through the silicone rubber layer to partially or completely dissolve out the unhardened light-sensitive resin layer and then physically removing the silicone rubber layer thereon. If images are formed in such a manner and the hardening of the silicone rubber layer is insufficient, the silicone rubber layer of the resulting lithographic printing plate wears out during printing or it has a low adhesion to the light-sensitive layer and consequently the printing plate does not exhibit sufficient printing durability.

SUMMARY OF THE INVENTION

Accordingly, one object of the present invention is to provide a PS plate requiring no dampening water which has high sensitivity, whose silicone rubber layer shows good hardening properties and which can provide a lithographic printing plate requiring no dampening water having good printing durability.

The inventors of this invention have conducted intensive studies to eliminate the foregoing disadvantages associated with the conventional techniques, have found out that a PS plate having good image-forming properties and hence a lithographic printing plate requiring no dampening water, which has excellent printing durability can be obtained by incorporating a specific photopolymerizable monomer into the light-sensitive resin layer of a PS plate which comprises a substrate provided thereon with, in order, a light-sensitive layer and a silicone rubber layer and have completed the present invention on the basis of this finding.

According to the present invention, the foregoing object can effectively be attained by providing a PS plate requiring no dampening water which comprises, a substrate, a light-sensitive resin layer formed on the substrate and a silicone rubber layer formed on the light-sensitive resin layer and obtained by crosslinking through an addition reaction between the groups ≡Si—H and —CH=CH—, wherein the light-sensitive resin layer comprises the following components:

(i) at least one monomer represented by the following general formula (I):

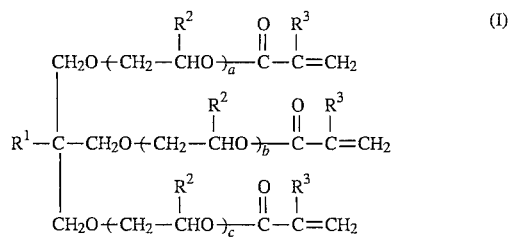

(wherein a+b+c=6 to 30 if $R^1$ represents H or a substituted or unsubstituted alkyl group having 1 to 10 carbon atoms; a+b+c+d=8 to 40 if $R^1$ represents the group:

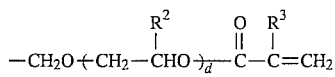

or a+b+c+d+e+f=12 to 60 if $R^1$ represents the group:

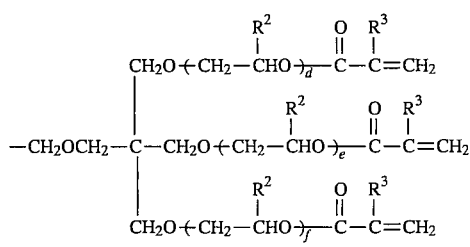

a to f may be the same or different and each represents an integer; $R^2$ and $R^3$ may be the same or different (i.e., $R^2$ and $R^2$, $R^2$ and $R^3$, or $R^3$ and $R^3$ may be the same or different) and each represents a hydrogen atom or a methyl group)

(ii) a photopolymerization initiator; and
(iii) a polymeric compound having film-forming ability.

DESCRIPTION OF THE PREFERRED EMBODIMENTS

The present invention will hereinafter be explained in more detail.

The PS plate requiring no dampening water and hence the resulting lithographic printing plate requiring no dampening water must have flexibility such that it can be put on the usual printing press and can withstand the load applied thereto during the printing operation. Therefore, typical examples of substrates usable in the invention include coated paper, metal plates such as an aluminum plate, plastic films such as a polyethylene terephthalate film, rubber and composites thereof. The surface of the substrate may be coated with a primer layer for preventing halation and for other purposes.

Various kinds of primer layers can be used for improving the adhesion between the substrate and the light-sensitive resin layer, for inhibiting halation and for enhancing image-dyeing ability and printing property. Specific examples thereof include those obtained by hardening, prior to the application of a light-sensitive resin layer, a variety of light-sensitive polymers through exposure to light as disclosed in J.P. KOKAI No. Sho 60-229031; those formed by hardening epoxy resins by heating as disclosed in J.P. KOKAI No. Sho 62-50760; those obtained by hardening gelatin as disclosed in J.P. KOKAI No. Sho 63-133151 (=U.S. Pat. No. 4,861,698); and those prepared from urethane resins as disclosed in J.P. KOKAI No. Hei 3-200965 and Japanese Patent Application (hereinafter referred to as J.P.A.) Hei 2- 79572. In addition, it is effective to use those obtained by hardening casein.

The primer composition may comprise, for softening the same, a polymer having a glass transition point of not more than room temperature such as polyurethane, polyamide, styrene/butadiene rubber, carboxyl-modified styrene/butadiene rubber, acrylonitrile/butadiene rubber, carboxylic acid-modified acrylonitrile/butadiene rubber, polyisoprene, acrylate rubber, polyethylene, or chlorinated polyethylene or polypropylene. The amount thereof is not critical as long as the composition containing them can form a film layer. Alternatively, the primer layer may likewise be prepared from the foregoing polymer alone.

The primer composition may further comprise additives such as a dye, a pH indicator, an agent or composition for obtaining a visible image immediately after imagewise exposure, a photopolymerization initiator, an auxiliary agent for adhesion (such as a polymerizable monomer, a diazo resin, a silane coupling agent, a titanate coupling agent or an aluminum coupling agent), a white pigment and/or silica powder.

In general, the amount of the primer layer to be applied desirably ranges from 0.1 to 20 g/m$^2$ and preferably 1 to 10 g/m$^2$ (weighed after drying).

The light-sensitive resin layer used in the invention comprises (i) at least one monomer represented by the foregoing general formula (I); (ii) a photopolymerization initiator; and (iii) a polymeric compound having film-forming ability. Moreover, the light-sensitive resin layer may optionally comprise (iv) a monomer or an oligomer carrying an ethylenically unsaturated group other than the monomer represented by Formula (I).

Component (i): Monomer of Formula (I)

Examples of the substituted or unsubstituted alkyl groups having 1 to 10 carbon atoms in the definition of $R^1$ in Formula (I) are methyl, ethyl, propyl, t-butyl, hydroxymethyl, hydroxyethyl and hydroxypropyl groups, but the present invention is not restricted to these specific examples.

Specific examples of the monomers of Formula (I) are those listed below, but the present invention is by no means limited to these specific examples. Moreover, these monomers may also be used in combination.

| Compound | $R^1$ | $R^2$ | $R^3$ | a + b + c + d + e + f |
|---|---|---|---|---|
| A | C$_2$H$_5$ | H | H | 9 |
| B | C$_2$H$_5$ | H | H | 15 |
| C | C$_2$H$_5$ | H | CH$_3$ | 15 |
| D | C$_2$H$_5$ | CH$_3$ | H | 15 |
| E | CH$_2$OH | H | H | 15 |
| F | CH$_3$ | H | H | 15 |
| G | $-CH_2O\!-\!(CH_2CH_2O)_{\overline{4}}\!-\!\overset{\underset{\shortparallel}{O}}{C}CH\!=\!CH_2$ | H | H | 20 |

-continued

| Compound R$^1$ | R$^2$ | R$^3$ | a + b + c + d + e + f |
|---|---|---|---|
| H $-CH_2OCH_2-\overset{\displaystyle CH_2O+CH_2CH_2O\ \overline{)_d}\overset{O}{\overset{\|}{C}}CH=CH_2}{\underset{\displaystyle CH_2O+CH_2CH_2O\ \overline{)_f}\overset{O}{\overset{\|}{C}}CH=CH_2}{\underset{\|}{C}}}-CH_2O+CH_2CH_2O\ \overline{)_e}\overset{O}{\overset{\|}{C}}CH=CH_2$ | H | H | 30 |

If the sum of a to f of Formula (I) is small, the hydrophilicity of the monomers is reduced. Thus, the monomers are liable to be easily dissolved in solvents used for applying a silicone rubber layer and correspondingly the curing characteristics of the addition type silicone rubber layer are lowered. On the other hand, if the sum is large and the monomer is used in the same weight ratio as that for the monomer in which the sum is small, the number of the unsaturated groups is reduced and the sensitivity of the resulting light-sensitive material is correspondingly lowered. For this reason, the amount of the monomer as Component (i) generally ranges from 1 to 70% by weight and preferably 3 to 50% by weight on the basis of the total weight of the light-sensitive composition.

Component (ii): Photopolymerization Initiator

Examples of photopolymerization initiators usable in the present invention include vicinal polyketaldonyl compounds as disclosed in U.S. Pat. No. 2,367,660; α-carbonyl compounds as disclosed in U.S. Pat. Nos. 2,367,661 and 2,367,670; acyloin ethers as disclosed in U.S. Pat. No. 2,448,828; aromatic acyloin compounds which are substituted with hydrocarbon groups at the α-position as disclosed in U.S. Pat. No. 2,722,512; polynucleic quinone compounds as disclosed in U.S. Pat. Nos. 3,046,127 and 2,951,758; combinations of triarylimidazole dimer/p-aminophenyl ketone as disclosed in U.S. Pat. No. 3,549,367; benzothiazole compounds as disclosed in U.S. Pat. No. 3,870,524; benzothiazole compounds/trihalomethyl-s-triazine compounds as disclosed in U.S. Pat. No. 4,239,850; acridine and phenazine compounds as disclosed in U.S. Pat. No. 3,751,259; oxadiazole compounds as disclosed in U.S. Pat. No. 4,212,970; trihalomethyl-s-triazine compounds having chromophoric groups as disclosed in U.S. Pat. Nos. 3,954,475 and 4,189,323 and J.P. KOKAI Nos. Sho 53-133428, Sho 60-106557, Sho 62-58241 (=U.S. Pat. No. 4,741,985) and Sho 63-153142; and benzophenone group-containing peroxy ester compounds as disclosed in J.P. KOKAI Nos. 59-197401 (=EP-A-126541) and Sho 60-76503. These photopolymerization initiators may be used alone or in combination.

The amount of these photopolymerization initiators to be incorporated ranges from 0.1 to 20% by weight and preferably 1 to 10% by weight on the basis of the total weight of the light-sensitive composition.

Component (iii): Film-Forming Polymeric Compound

Examples of film-forming polymeric compounds usable in the present invention include methacrylic acid copolymers, acrylic acid copolymers, crotonic acid copolymers, maleic acid copolymers, partially esterified maleic acid copolymers, acidic cellulose derivatives, polyvinyl pyrrolidone, polyethylene oxide, alcohol-soluble nylons, polyesters, unsaturated polyesters, polyurethane, polystyrene, epoxy resins, phenoxy resins, polyvinyl butyral, polyvinyl formal, polyvinyl chloride, polyvinyl alcohol, polyvinyl alcohol partially modified with acetal, water-soluble nylons, water-soluble urethane polymers, gelatin and water-soluble cellulose derivatives.

In addition to the foregoing polymeric compounds, it is also possible to use those having, on the side chains, photopolymerizable or photocrosslinkable olefinically unsaturated double bonds. Examples of such polymeric compounds are allyl (meth)acrylate-co-(meth)acrylic acid-co-optional other addition-polymerizable vinyl monomer and alkali metal or amine salts thereof as disclosed in J.P. KOKAI No. Sho 59-53836 (=U.S. Pat. No. 4,687,727); reaction products of hydroxyethyl (meth) acrylate-co-(meth)acrylic acid-co-alkyl (meth)acrylate and alkali metal or amine salts thereof with (meth)acrylic acid chloride as disclosed in J.P. KOKOKU No. Sho 59-45979; addition products of maleic anhydride copolymers and pentaerythritol triacrylates through half-esterification and alkali metal or amine salts thereof as disclosed in J.P. KOKAI No. 59-71048 (=U.S. Pat. No. 4,537,855); addition products of styrene/maleic anhydride copolymer with monohydroxyalkyl (meth) acrylate, polyethylene glycol mono(meth)acrylate or polypropylene glycol mono(meth)acrylate through half-esterification and alkali metal or amine salts thereof; products obtained by reacting a part of carboxyl groups of (meth)acrylic acid copolymers or crotonic acid copolymers with glycidyl (meth)acrylate and alkali metal or amine salts thereof; reaction products of hydroxyalkyl (meth)acrytate copolymers, polyvinyl formal or polyvinyl butyral with maleic anhydride or itaconic anhydride and alkali metal or amine salts thereof; reaction products of hydroxyalkyl (meth) acrylate/(meth)acrylic acid copolymers with 1:1 adducts of 2,4 -tolylene diisocyanate/hydroxyalkyl (meth)acrylate and alkali metal or amine salts thereof; products obtained by reacting a part of (meth)acrylic acid copolymers with allyl glycidyl ether and alkali metal or amine salts thereof as disclosed in J.P. KOKAI No. Sho 59-53836 (=U.S. Pat. No. 4,687,727); vinyl (meth)acrylate/(meth)acrylic acid copolymers and alkali metal or amine salts thereof; allyl (meth)acrylate/sodium styrenesulfonate copolymers; vinyl (meth)acrylate/sodium styrenesulfonate copolymers, allyl (meth)acrylate/sodium acrylamido-1,1-dimethylethylenesulfonate copolymers, vinyl (meth)acrylate/sodium acrylamido-1,1-dimethylethylenesulfonate copolymers, 2-allyloxyethyl methacrylate/methacrylic acid copolymers and 2-allyloxyethyl methacrylate/2-methacryloxyethyl hydrogen succinate copolymers. These polymeric compounds may be used alone or in combination.

These polymeric compounds are used in an amount ranging from 20 to 95% by weight and preferably 40 to 90% by weight on the basis of the total weight of the light-sensitive composition.

Component (iv): Ethylenically Unsaturated Group-Containing Monomers or Oligomers Other Than the Monomers of Formula (I)

The ethylenically unsaturated group-containing monomers or oligomers other than the monomers of Formula (I) optionally used in the present invention are, for instance, monomers or oligomers carrying at least one photopolymerizable (meth) acrylate or allyl group. Specific examples thereof are those listed below:

(A) (meth)acrylates of alcohols such as ethanol, propanol, hexanol, octanol, cyclohexanol, glycerin, trimethylolpropane and pentaerythritol;

(B) Reaction products of amines (for instance, methylamine, ethylamine, butylamine, benzylamine, ethylenediamine, hexylenediamine, diethylenetriamine, hexamethylenediamine, xylylenediamine, dimethylamine, diethylamine, ethanolamine, diethanolamine and aniline) with glycidyl acrylate, allyl glycidyl or glycidyl methacrylate;

(C) Reaction products of carboxylic acids (for instance, acetic acid, propionic acid, benzoic acid, (meth)acrylic acid, succinic acid, maleic acid, phthalic acid, tartaric acid and citric acid) with glycidyl (meth)acrylate, allyl glycidyl or tetraglycidyl m-xylylenediamine;

(D) Amide derivatives such as (meth)acrylamide, N-methylolacrylamide and methylenebisacrylamide; and (E) Reaction products of epoxy compounds with (meth)acrylic acid.

Specific examples thereof include urethane acrylates such as those disclosed in J.P. KOKOKU Nos. Sho 48-41708 and Sho 50- 6034 and J.P. KOKAI No. Sho 51-37193; polyester acrylates such as those disclosed in J.P. KOKAI No. Sho 48-64183 and J.P. KOKOKU Nos. Sho 49-43191 and Sho 52-30490; polyfunctional (meth)acrylates such as epoxy acrylates obtained by reacting epoxy resins with (meth)acrylic acid; and N-methylol acrylamide derivatives as disclosed in U.S. Pat. No. 4,540,649. In addition, it is also possible to use those disclosed in Journal of The Adhesive Society of Japan, 1984, 20, No. 7, pp. 300–308 as photohardenable monomers and oligomers.

The foregoing polyfunctional monomers may comprise at least two unsaturated groups selected from acryl, methacryl and allyl groups.

These monomers and oligomers may be used alone or in combination. The total amount of the monomers and oligomers as Components (i) and (iv) ranges from 1 to 70% by weight and preferably 3 to 50% by weight on the basis of the total weight of the light-sensitive composition.

Other Components

In addition to the foregoing components, the light-sensitive composition preferably comprises a heat polymerization inhibitor such as hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole and optionally a pigment or dye for coloring the light-sensitive resin layer and/or a pH indicator or leuco dye as an agent or composition for obtaining an image immediately after exposure to light.

The light-sensitive layer may further comprise, depending on purposes, a small amount of a silicone compound such as polydimethylsiloxane, methylstyrene-modified polydimethylsiloxane, olefin-modified polydimethylsiloxane, polyether-modified polydimethylsiloxane, silane coupling agent or silicone di(meth)acrylate.

A silicone or fluorine atom-containing surfactant may also be incorporated into the light-sensitive composition for improving coating properties thereof.

Further a diazo resin may be added to the light-sensitive resin layer in order to improve the adhesion between the light-sensitive resin layer and the primer layer.

The amount of these additives is in general not more than 10% by weight on the basis of the total weight of the light-sensitive composition.

The light-sensitive composition may optionally comprise silica powder or hydrophobic silica powder whose surface is treated with a (meth)acryloyl or allyl group-containing silane coupling agent in an amount of not more than 50% by weight on the basis of the total weight of the composition for the purpose of enhancing the adhesion thereof to the silicone rubber layer subsequently applied thereto.

The foregoing light-sensitive composition is applied onto the surface of a substrate in the form of a solution in a proper solvent such as 2-methoxy ethanol, 2-methoxyethyl acetate, propylene glycol methyl ethyl acetate, methyl lactate, ethyl lactate, propylene glycol monomethyl ether, methanol, ethanol, methyl ethyl ketone, water or mixture thereof. The amount thereof to be applied suitably ranges from 0.1 to 20 $g/m^2$ and preferably 0.5 to 10 $g/m^2$ (weighed after drying).

The silicone rubber layer used in the invention which is crosslinked through the addition reaction between $\equiv$Si—H and —CH= CH— groups can be obtained through the reaction of a polyvalent hydrogen organopolysiloxane with a polysiloxane having at least two —CH=CH— groups in the molecule and desirably those obtained by crosslinking the composition comprising the following components through hardening:

(i) 100 parts by weight of an organopolysiloxane carrying at least two alkenyl groups (preferably vinyl groups) in the molecule which are directly bonded to the silicon atom;

(ii) 0.1 to 1,000 parts by weight of a hydrogen organopolysiloxane having at least two $\equiv$Si—H bonds in the molecule; and (iii) 0.00001 to 10 parts by weight of a catalyst for addition reaction.

The alkenyl groups of Component (i) may be present either at the ends of the molecular chain or in the middle thereof. Component (i) may also have organic groups other than alkenyl groups, which may be selected from substituted or unsubstituted alkyl and aryl groups. Component (i) may comprise a small amount of hydroxyl group.

Component (ii) forms a silicone rubber layer through the reaction with Component (i) and further serves to impart adhesion to the light-sensitive layer. The hydrogen atom of Component (ii) may be present either at the ends of the molecular chain or in the middle thereof. Component (ii) may also have organic groups other than hydrogen atoms, which may be selected from the same groups as those listed above in connection with Component (i). It is preferred that not less than 60% of the total number of organic groups of Components (i) and (ii) be methyl groups from the viewpoint of the ink repellency. The molecular structures of Components (i) and (ii) may be linear, cyclic or branched ones and the molecular weight of at least one of them exceeds 1,000 while taking physical properties of the resulting rubber into consideration. Further it is rather preferred that the molecular weight of Component (i) exceeds 1,000.

Examples of Components (i) include α, ω-divinylpolydimethylsiloxane and (methylvinylsiloxane) (dimethylsiloxane) copolymer having methyl groups at both ends and examples of Component (ii) include polydimethylsiloxane having hydrogen atoms at both ends, α, ω-dimethylpolymethyl hydrogen siloxane, imethyl hydrogen siloxane) (dimethylsiloxane) copolymer having methyl groups at both ends and cyclic polymethyl hydrogen siloxane.

The catalysts for addition reaction as Component (iii) can arbitrarily be selected from those known ones. In particular, they are desirably selected from platinum compounds such as elemental platinum, platinum chloride, chloroplatinic acid and platinum coordinated with olefins.

The composition for silicone rubber layer may further comprise a crosslinking inhibitor, for instance, a vinyl group-containing organopolysiloxane such as tetracyclo(methylvinyl) siloxane, an alcohol having a carbon-carbon triple bond, acetone, methyl ethyl ketone, methanol, ethanol or propylene glycol monomethyl ether in order to control the hardening rate of the composition.

These compositions undergo an addition reaction as soon as the foregoing three components are admixed and hence the hardening thereof is initiated. However, it should be noted that the hardening rate of the composition rapidly increases as the reaction temperature is raised. For this reason, it is necessary to extend the pot life, or the time extending from the preparation thereof till it is converted to rubber and to shorten the time required for hardening it on a light-sensitive layer. The composition is preferably hardened in a temperature range which does not affect the properties of the substrate and the light-sensitive resin layer and is preferably maintained at a high temperature until it is completely hardened in order to achieve stable adhesion to the light-sensitive resin layer.

In addition to the foregoing components, the composition may optionally comprise a known adhesion-imparting agent such as an alkenyltrialkoxysilane and a component for the condensed silicone rubber layer such as hydroxyl group-containing organopolysiloxane and/or hydrolyzable functional group-containing silane (or siloxane) as well as a known additive such as silica for enhancing the strength of the resulting rubber.

The silicone rubber layer used in the present invention serves as an ink repellent layer. Therefore, if the thickness thereof is too small, the ink repellency thereof is reduced and the layer is liable to be damaged. On the other hand, if it is too thin, the developability thereof is impaired. Accordingly, the thickness thereof desirably ranges from 0.5 to 5 g/m$^2$ and preferably 1 to 3 g/m$^2$ (weighed after drying).

The addition type silicone rubber layer used in the invention is relatively slightly influenced by humidity and further it can be crosslinked rapidly. Therefore, rubber layers having uniform physical properties can easily be obtained. On the other hand, if a condensed silicone rubber layer is used and the light-sensitive resin layer comprises carboxylic acid, the silicone rubber layer is often insufficiently hardened depending on the kinds of the crosslinking agents used. However, the addition type silicone rubber layer can sufficiently be hardened even if carboxylic acids are present in the light-sensitive layer. Therefore, the use of the addition type silicone rubber layer makes it possible to use a light-sensitive resin layer comprising carboxylic acids. This in turn leads to the formation of a PS plate which can be developed with a developer mainly comprising water or an alkaline water and thus the PS plate can easily be designed.

The PS plate requiring no dampening water may further comprise various kinds of silicone rubber layers applied onto the foregoing silicone rubber layer or an adhesive layer between the light-sensitive layer and the silicone rubber layer for enhancing the adhesion therebetween or for suppressing a poisoning effect of the catalyst present in the silicone rubber layer.

Moreover, a protective layer may be applied onto the surface of the silicone rubber layer. The protective layer may be formed by laminating the silicone rubber layer with a transparent film such as a polyethylene, polypropylene, polyvinyl chloride, polyvinylidene chloride, polyvinyl alcohol, polyethylene terephthalate or cellophane film or by coating the silicone rubber layer with a polymer. These films may be used in the oriented form. In addition, these films may be matted for ensuring the adhesion to an original in a printing frame during imagewise exposure to light.

The PS plate requiring no dampening water is imagewise exposed to light through an original transparency and then developed with a developer capable of partially or completely dissolving or swelling the light-sensitive resin layer on the image area (or non-exposed area) or a developer capable of swelling the non-exposed silicone rubber layer. In the development, both the light-sensitive resin layer and the silicone rubber layer or only the silicone rubber layer on the image area can be removed by controlling the intensity of the developer used.

The developer used in the present invention may be those known as developers for PS plates requiring no dampening water. Preferred examples thereof include aliphatic hydrocarbons such as hexane, heptane, "Isopar E, H, G" (trade names of aliphatic hydrocarbons available from ESSO Chemical Company), gasoline and kerosine; aromatic hydrocarbons such as toluene and xylene; halogenated hydrocarbons such as trichlene, to which the following polar solvents are addd or the polar solvents per se:

Alcohols such as methanol, ethanol, propanol, benzyl alcohol, ethylene glycol monophenyl ether, 2-methoxyethanol, 2-ethoxyethanol, carbitol monoethyl ether, carbitol monomethyl ether, triethylene glycol monoethyl ether, propylene glycol monomethyl ether, propylene glycol monoethyl ether, dipropylene glycol monomethyl ether, polyethylene glycol monomethyl ether, propylene glycol, polypropylene glycol, triethylene glycol and tetraethylene glycol;

Ketones such as acetone and methyl ethyl ketone;

Esters such as ethyl acetate, methyl lactate, ethyl lactate, butyl lactate, propylene glycol monomethyl ether acetate, carbitol acetate, dimethyl phthalate and diethyl phthalate;

Other polar solvents such as triethyl phosphate and tricresyl phosphate.

Moreover, it is also possible to use, as developers, those obtained by adding water to the foregoing developers mainly comprising organic solvents; the foregoing organic solvents solubilized in water by the use of a solubilizing agent such as a surfactant; these developers which further comprise an alkaline agent such as sodium carbonate, monoethanolamine, diethanolamine, triethanolamine, sodium silicate, potassium silicate, sodium hydroxide, potassium hydroxide or sodium borate; or tap water per se or an alkaline water.

A dye such as Crystal Violet, Victoria Pure Blue or Astrazone Red may be added to the developer to simultaneously dye image portions.

Particularly preferred are those comprising 0.1 to 100% by weight of a propylene oxide derivative having a molecular weight ranging from 100 to 1,000 as disclosed in J.P. KOKOKU No. Sho 63-21890 (=U.S. Pat. No. 4,378,423) and aqueous developers comprising an ethylene glycol monoalkyl ether or diethylene glycol monoalkyl ether (wherein the alkyl group has 5 to 8 carbon atoms) as disclosed in J.P. KOKAI NO. Hei 3-5756 (=EP-A- 400657) and J.P.A. No. Hei 2-27859.

The development can be performed by any known manner, for instance, by rubbing the plate surface with a developing pad containing the foregoing developer or by pouring the developer on the plate surface and then rubbing the surface with a developing brush in water. Thus, the silicone rubber layer and the light-sensitive layer on the image area are removed, the surface of the substrate or the primer layer is correspondingly exposed and serves as an ink receiving portion. Alternatively, only the silicone rubber layer on the image area is removed, the light-sensitive layer is thus exposed and serves as an ink receiving portion.

Moreover, the imagewise exposed PS plate of the present invention can also be developed by the method disclosed in J.P. KOKOKU No. Sho 63-33140 which comprises the steps of dissolving out a part or whole of the light-sensitive layer on the image area with a developer capable of dissolving at least part of the light-sensitive layer on the image area and then rubbing the plate surface in the presence of water or a solvent mainly comprising water, which does not swell the silicone rubber layer, to remove the silicone rubber layer on the image area. In this case, the development is preferably performed by the method disclosed in J.P. KOKAI No. Sho 63-163357 or an automatic developing machine for carrying out this method.

The developer comprises a dye so that the exposed image portion (light-sensitive layer) can be dyed for the purpose of confirming the image-forming properties of the PS plate thus obtained or for the purpose of the plate examination. If the developer used does not comprise any dye for dyeing the exposed image portion, the PS plate is treated with a dyeing solution after the development. The image portion is lightly rubbed with a soft pad containing the dyeing solution to thus dye only the exposed portion of the light-sensitive layer and thus it can be confirmed whether even the highlight portion is sufficiently developed or not. The dyeing solutions used are, for instance, those obtained by dissolving or dispersing at least one dye selected from the group consisting of disperse dyes, acid dyes and basic dyes in a solvent such as water, alcohols, ketones, ethers or mixture thereof. It is also effective to add, to the dyeing solution, carboxylic acids, amines, surfactants and/or dyeing aids for improving the dyeing ability of the solution.

The PS plate requiring no dampening water of the present invention has a layer structure which comprises a substrate provided thereon with, in order, a light-sensitive resin layer, an addition type silicone rubber layer wherein the light-sensitive resin layer comprises a 3 to 6 functional group-containing monomer carrying 6 to 60 ethylene oxide or propylene oxide groups in the molecule, a polymeric compound having a film-forming ability and a photopolymerization initiator. Therefore, the hardening properties of the addition type silicone rubber layer is greatly improved and thus there can be provided PS plates exhibiting excellent sensitivity and hence lithographic printing plates having good printing durability.

The present invention will hereinafter be explained in more detail with reference to the following non-limitative working Examples and the effects practically attained by the present invention will also be discussed in detail in comparison with Comparative Examples.

EXAMPLES 1 to 8 and COMPARATIVE EXAMPLES 1 to 5

An aluminum plate of JIS A 1050 which had been degreased in the usual manner was immersed in a 1% aqueous solution of KBM 603 (available from Shin-Etsu Chemical Co., Ltd.) as an aminosilane coupling agent and then dried at room temperature. A primer solution having the following composition was applied onto the aluminum plate in an amount of 3 g/m$^2$ (weighed after drying) and dried and hardened at 140° C. for 2 minutes.
Primer Solution

| Component | Amount (part by weight) |
| --- | --- |
| Sanprene IB1700D (30% solution of terminal hydroxyl group-containing thermoplastic polyurethane resin in methyl ethyl ketone; available from Sanyo Chemical Idustries, Ltd.) | 10 |
| Takenate DI10N (75% ethyl acetate solution of polyfunctional isocyanate compound; available from Takeda Chemical Industries, Ltd.) | 0.5 |
| TiO$_2$ | 0.1 |
| Defenser MCF 323 (30% solution of fluorine atom-containing nonionic surfactant in methyl isobutyl ketone; available from Dainippon Ink and Chemicals, Inc.) | 0.03 |
| propylene glycol methyl ether acetate | 50 |
| methyl lactate | 20 |

A light-sensitive solution having the following composition was applied onto the aluminum plate provided thereon with the primer layer in an amount of 4 g/m$^2$ (weighed after drying) and then dried at 100° C. for one minute.

Light-Sensitive Solution

| Component | Amount (part by weight) |
| --- | --- |
| Crysbon 3006LV (thermoplastic polyurethane, available from Dainippon Ink and Chemicals, Inc.) | 1.5 |
| xylylene diamine/glycidyl methacrylate (1:4 molar ratio) adduct | 1.0 |
| monomer (see Table 1) | 1.0 |
| ethyl Michler's ketone | 0.15 |
| 2,4-diethylthioxantone | 0.15 |
| naphthalenesulfonate of Victoria Pure Blue BOH | 0.01 |
| Defenser MCF 323 (30% solution of fluorine atom-containing nonionic surfactant in methyl isobutyl ketone; available from Dainippon Ink and Chemicals, Inc.) | 0.03 |
| methyl ethyl ketone | 10 |
| propylene glycol methyl ether | 20 |

Then a composition for silicone rubber layer having the following composition was applied onto the foregoing photopolymerizable light-sensitive layer in an amount of 2.0 g/m$^2$ (weighed after drying) and then dried at 140° C. for 2 minutes to give a hardened silicone rubber layer.

Composition for Silicone Rubber Layer

| Component | Amount (part by weight) |
| --- | --- |
| α,ω-divinylpolydimethylsiloxane (degree of polymerization = about 700) | 9 |
| compound of the following formula: | 1.2 |

$$CH_3-Si(CH_3)_2-O-(SiO(CH_3)_2)_{30}-(SiO(CH)(CH_3))_{10}-Si(CH_3)_2-CH_3$$

| polydimethylsiloxane (degree of polymerization = about 8,000) | 0.5 |
| olefin-chloroplatinic acid | 0.2 |
| polymerization inhibitor | 0.3 |

-continued

| Composition for Silicone Rubber Layer | |
|---|---|
| Component | Amount (part by weight) |
| Isopar G (available from ESSO Chemical Company) | 140 |

A biaxially oriented, one-side matted polypropylene film having a thickness of 12 μm (oxygen permeability: 4,000 cc/m²/24 hr./atm at 20° C.) was laminated with the silicone rubber layer applied to the aluminum plate so that the non-matted surface thereof came in contact with the silicone rubber layer to give a PS plate requiring no dampening water.

A positive film carrying half-tone dot pattern of 200 lines/inch and a gray scale (G/S) having an optical density difference of 0.15 were put on the PS plate, then the assembly was exposed to light for 30 counts using a vacuum exposure machine: FT261V UDNS ULTRA-PLUS FLIP-TOP PLATE MAKER (available from Nu Arc Company), then the laminated film was peeled off, the plate was immersed in a solution of tripropylene glycol maintained at 40° C. for one minute, rubbed with a developing pad in water to remove the silicone rubber layer on the non-exposed area to thus give a lithographic printing plate requiring no dampening water.

The gray scale sensitivity of the plate was evaluated at this stage. Each plate was put on Heidelberg GTO printing press from which the dampening water supplying apparatus was dismantled and printing operations were performed using TOYO KING ULTRA TUK Aqualess G Sumi Ink (available from Toyo Ink Manufacturing Co., Ltd. ) and the number of copies obtained (printing durability) till the silicone rubber layer on the non-image area was broken and correspondingly the printing plate caused background contamination was counted or evaluated. The results obtained are summarized in Table 1.

TABLE 1

| Ex. No. | Monomer Used A: $-CO-CH=CH_2$  M: $-CO-C(CH_3)=CH_2$ |
|---|---|
| 1 | Compound A |
| 2 | Compound B (SARTOMER 9035; available from SARTOMER Co., Ltd.) |
| 3 | Compound C |
| 4 | Compound D |
| 5 | Compound E |
| 6 | Compound F |
| 7 | Compound G |
| 8 | Compound H |

1* trimethylolpropane triacrylate (Aronix M309; available from Toagosei Chemical Industry Co., Ltd.)
2* $AO-(CH_2CH_2O)_{14}-A$ (A 600; available from Shinnakamura Chemical Co., Ltd.)
3* $MO-(CH_2CH(CH_3)O)_9M$ (9PG; available from Shinnakamura Chemical Co., Ltd.)
4* $(AOCH_2)_4C$ (A-TMMT; available from Shinnakamura Chemical Co., Ltd.)

5*
$$C_2H_5-C\begin{array}{l}CH_2O-CH_2CH_2O-A\\ -CH_2O-CH_2CH_2O-A?\\ CH_2O-CH_2CH_2O-A\end{array}$$

(SARTOMER 454; available from SARTOMER Co., Ltd.)

(*): Comparative Example

TABLE 2

| Ex. No. | Printing Durability | G/S Sensitivity (30 counts) |
|---|---|---|
| 1 | 70,000 | 10 |
| 2 | 80,000 | 9 |
| 3 | 80,000 | 8 |
| 4 | 70,000 | 8 |
| 5 | 80,000 | 9 |
| 6 | 80,000 | 9 |
| 7 | 70,000 | 10 |
| 8 | 70,000 | 10 |
| 1* | 1,000 | 10 |
| 2* | 70,000 | 6 |
| 3* | 70,000 | 6 |
| 4* | 1,000 | 10 |
| 5* | 1,000 | 10 |

The results listed in Table 2 clearly indicate that PS printing plates requiring no dampening water having high sensitivity could be obtained using the monomer of the present invention and that lithographic printing plates requiring no dampening water excellent in printing durability could be prepared from the PS plates.

EXAMPLE 9

An aluminum plate of JIS A1050 having a thickness of 0.3 mm which had been degreased and treated with a silicate was immersed in a 1% solution of $PF_6$ salt of p-diazodiphenylamine/paraformaldehyde condensate in methyl cellosolve, withdrawn from the solution and allowed to stand in air to dry the same. A photopolymerizable light-sensitive solution having the following composition was applied onto the aluminum plate in an amount of 4 g/m² (weighed after drying) and then dried at 100° C. for one minute.

| Photopolymerizable Light-Sensitive Solution | |
|---|---|
| Component | Amount (part by weight) |
| polyamide resin of 1,3-bis(aminomethyl)siloxane/ cyclohexane-1,4-dicarboxylic acid/hexamethylene-diamine/adipic acid/ε-caprolactam (molar ratio = 1:1:1:1:2.2) | 1.5 |
| xylylene diamine/glycidyl methacrylate (1:4 molar ratio) adduct | 0.8 |
| monomer (Compound B) | 0.7 |
| ethyl Michler's ketone | 0.2 |
| 2,4-diisopropylthioxanthone | 0.1 |
| naphthalenesulfonate of Victoria Pure Blue BOH | 0.01 |
| Defenser MCF 323 (30% solution of fluorine atom-containing nonionic surfactant in methyl isobutyl ketone; available from Dainippon Ink and Chemicals, Inc.) | 0.03 |
| methyl ethyl ketone | 10 |
| propylene glycol methyl ether | 20 |

Then the same composition for addition type silicone rubber layer as used in Example 1 was applied onto the foregoing light-sensitive layer and then dried. A biaxially oriented, one-side matted polypropylene film having a thickness of 12 μm was laminated with the silicone rubber layer as in Example 1, a positive film was put on the resulting PS plate, then the PS plate was exposed to light for 30 counts using the same vacuum exposure machine used in Example 1, thereafter the laminated film was peeled off, the plate was developed with the same developer used in Example 1 to give a lithographic printing plate requiring no dampening water. Properties of the resulting printing plate was evaluated in the same manner used in Example 1 and it was found that the G/S sensitivity of the PS plate was 9th step and the printing durability of the lithographic printing plate requiring no dampening water was 90, 000.

EXAMPLE 10

A primer solution having the following composition was applied onto the same aluminum plate used in Example 9 in an amount of 3 g/m² and dried at 140° C. for 2 minutes.

| Primer Solution | |
|---|---|
| Component | Amount (part by weight) |
| Crysbon 3006LV (thermoplastic polyurethane, available from Dainippon Ink and Chemicals, Inc.) | 15 |
| PF$_6$ salt of p-diazodiphenylamine/paraformaldehyde condensate | 0.1 |
| TiO$_2$ | 0.5 |
| Defenser MCF 323 (30% solution of fluorine atom-containing nonionic surfactant in methyl isobutyl ketone; available from Dainippon Ink and Chemicals, Inc.) | 0.3 |
| propylene glycol methyl ether | 100 |
| methyl ethyl ketone | 50 |
| methyl lactate | 5 |
| pure water | 2 |

The aluminum plate to which a primer layer had thus been applied was exposed to light for 30 counts by the same exposure machine used in Example 1. Then a light-sensitive layer, an addition type silicone rubber layer and a cover film were formed in the same manner used in Example 9 to give a PS plate. Properties of the resulting PS plate and a lithographic printing plate prepared therefrom were likewise evaluated. The G/S sensitivity of the PS plate was 9th step and the printing durability of the printing plate was estimated to be 120,000.

What is claimed is:

1. A presensitized plate requiring no dampening water for use in making a lithographic printing plate requiring no dampening water, which comprises a substrate, a light-sensitive resin layer formed on the substrate and a silicone rubber layer applied onto the light-sensitive layer and formed by crosslinking through an addition reaction between groups ≡Si—H and —CH═CH—, wherein the light-sensitive resin layer is formed from a light-sensitive composition which comprises the following components:

(i) from 1 to 50% by total weight of the light-sensitive composition of at least one monomer represented by the following general formula (I):

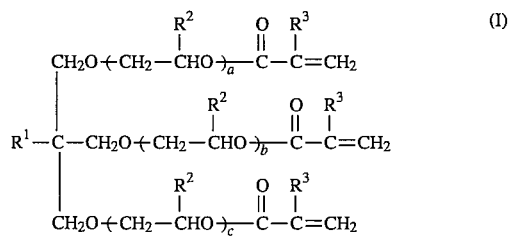

wherein a+b+c=6 to 30 if R$^1$ represents H or an alkyl group having 1 to 10 carbon atoms; a+b+c+d=8 to 40 if R$^1$ represents the group:

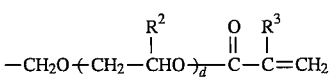

or a+b+c+d+e+f=12 to 60 if R$^1$ represents the group:

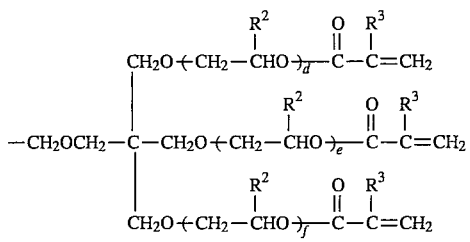

wherein a to f are the same or different and each represents an integer; R$^2$ and R$^3$ are the same or different and each represents a hydrogen atom or a methyl group;

(ii) a photopolymerization initiator; and (iii) a polymeric compound having film-forming ability.

2. The presensitized plate of claim 1 wherein the light-sensitive composition comprises the component (i) in an amount ranging from 3 to 50% by weight on the basis of the total weight of the light-sensitive composition.

3. The presensitized plate of claim 1 wherein the light-sensitive composition comprises the component (ii) in an amount ranging from 0.1 to 20% by weight on the basis of the total weight of the light-sensitive composition.

4. The presensitized plate of claim 3 wherein the light-sensitive composition comprises the component (ii) in an amount ranging from 1 to 10% by weight on the basis of the total weight of the light-sensitive composition.

5. The presensitized plate of claim 1 wherein the light-sensitive composition comprises the component (iii) in an amount ranging from 20 to 95% by weight on the basis of the total weight of the light-sensitive composition.

6. The presensitized plate of claim 5 wherein the light-sensitive composition comprises the component (iii) in an amount ranging from 40 to 90% by weight on the basis of the total weight of the light-sensitive composition.

7. The presensitized plate of claim 1 wherein the light-sensitive composition comprises, on the basis of the total weight of the light-sensitive composition, 1 to 50% by weight of the component (i), 0.1 to 20% by weight of the component (ii) and 20 to 95% by weight of the component (iii).

8. The presensitized plate of claim 7 wherein the light-sensitive composition comprises, on the basis of the total weight of the light-sensitive composition, 3 to 50% by weight of the component (i), 1 to 10% by weight of the component (ii) and 40 to 90% by weight of the component (iii).

9. The presensitized plate of claim 1 wherein the light-sensitive composition further comprises, as a component (iv), at least one-ethylenically unsaturated group-containing monomer or oligomer other than the monomer represented by the foregoing formula (I).

10. The presensitized plate of claim 9 wherein, in the light-sensitive composition, the total amount of the components (i) and (iv) ranges from 1 to 70% by weight on the basis of the total weight of the light-sensitive composition.

11. The presensitized plate of claim 10 wherein in the light-sensitive composition, the total amount of the components (i) and (iv) ranges from 3 to 50% by weight on the basis of the total weight of the light-sensitive composition.

12. The presensitized plate of claim 1 wherein the light-sensitive composition further comprises additives selected from the group consisting of dyes, pigments, pH indicators, silicone surfactants, fluorine atom-containing surfactants and diazo resins in an amount of not more than 10% by weight on the basis of the total weight of the light-sensitive composition.

13. The presensitized plate of claim 1 wherein the light-sensitive composition further comprises silica powder or hydrophobic silica powder whose surface is treated with a (meth) acryloyl or allyl group-containing silane coupling agent in an amount of not more than 50% by weight on the basis of the total weight of the light-sensitive composition.

14. The presensitized plate of claim 1 wherein the light-sensitive composition is applied to the substrate in an amount of about 0.1 to 20 g/m$^2$ expressed in terms of dry weight.

15. The presensitized plate of claim 14 wherein the light-sensitive composition is applied to the substrate in an amount of about 0.5 to 10 g/m$^2$ expressed in terms of dry weight.

16. The presensitized plate of claim 1 wherein the silicone rubber layer is obtained by hardening a composition comprising the following components through crosslinking:

(i) 100 parts by weight of an organopolysiloxane carrying at least two alkenyl groups in the molecule, which are directly bonded to the silicon atom;

(ii) 0.1 to 1,000 parts by weight of a hydrogen organopolysiloxane having at least two $\equiv$Si—H bonds in the molecule; and (iii) 0.00001 to 10 parts by weight of a catalyst for addition reaction.

17. The presensitized plate of claim 1 wherein the presensitized plate further comprises a primer layer between the substrate and the light-sensitive resin layer in a coated amount ranging from 0.1 to 20 g/m$^2$ expressed in terms of dry weight.

18. The presensitized plate of claim 17 wherein the coated amount of the primer layer ranges from 1 to 10 g/m$^2$ expressed in terms of dry weight.

19. The presensitized plate of claim 1 wherein the presensitized plate further comprises a protective layer on the silicone rubber layer.

20. The presensitized plate of claim 1 wherein $R^1$ in the formula (I) is $CH_3$ or $C_2H_5$.

21. The presensitized plate of claim 1 wherein $R^1$ is selected from the group consisting of $CH_3$ and $C_2H_5$, $R^2$ is H, $R^3$ is H, and a+b+c=15.

22. The presensitized plate of claim 1 wherein $R^1$ is $C_2H_5$, $R^2$ is H, $R^3$ is H, and a+b+c=15.

* * * * *